(12) United States Patent
Kim et al.

(10) Patent No.: US 8,330,365 B2
(45) Date of Patent: Dec. 11, 2012

(54) METHOD FOR FORMATION OF LINE PATTERN USING MULTIPLE NOZZLE HEAD AND DISPLAY PANEL MANUFACTURED BY THE METHOD

(75) Inventors: Hyun-Sik Kim, Daejeon (KR); Jung-Ho Park, Daejeon (KR)

(73) Assignee: LG Chem, Ltd., Seoul (KR)

( * ) Notice: Subject to any disclaimer, the term of this patent is extended or adjusted under 35 U.S.C. 154(b) by 705 days.

(21) Appl. No.: 12/448,755

(22) PCT Filed: Jan. 9, 2008

(86) PCT No.: PCT/KR2008/000119
§ 371 (c)(1),
(2), (4) Date: Jul. 6, 2009

(87) PCT Pub. No.: WO2008/084972
PCT Pub. Date: Jul. 17, 2008

(65) Prior Publication Data
US 2010/0045182 A1    Feb. 25, 2010

(30) Foreign Application Priority Data
Jan. 9, 2007   (KR) ........................ 10-2007-0002400

(51) Int. Cl.
*H01J 17/49* (2012.01)
*H01J 17/34* (2006.01)
(52) U.S. Cl. ............ 313/582; 313/581; 445/23; 445/24; 445/25

(58) Field of Classification Search .......... 313/581–604, 313/620, 621; 445/23–25, 46
See application file for complete search history.

(56) References Cited

U.S. PATENT DOCUMENTS

2006/0119270 A1 *  6/2006  Park .............................. 313/582
2007/0257615 A1 * 11/2007  Soh et al. ...................... 313/582

FOREIGN PATENT DOCUMENTS

| JP | 11-273557     | 10/1999 |
| JP | 2003-307613   | 10/2003 |
| JP | 2003-311204   | 11/2003 |
| JP | 2004-230660   | 8/2004  |
| KR | 10-2005-0083062 | 8/2005 |

\* cited by examiner

*Primary Examiner* — Anh Mai
*Assistant Examiner* — Nathaniel Lee
(74) *Attorney, Agent, or Firm* — McKenna Long & Aldridge, LLP

(57) ABSTRACT

A method for formation of a line pattern using a multiple nozzle head includes forming a cell region in which display cells with a height corresponding to a multiple of a line gap of nozzles provided to the multiple nozzle head are repeated in two dimensions; and forming different kinds of first and second line patterns alternatively repeated on the cell region by ink-jet printing using the multiple nozzle head. When the multiple nozzle head scans once, the first and second line patterns are formed at the same time under the condition that the height of the display cells and a gap between two associative line patterns are a multiple of the line gap of nozzles. This method may improve productivity by reducing the number of scans of the multiple nozzle head, and also decrease the possibility of open circuit occurring when forming a line pattern by ink jetting.

13 Claims, 6 Drawing Sheets

METHOD FOR FORMATION OF LINE PATTERN USING MULTIPLE NOZZLE HEAD AND DISPLAY PANEL MANUFACTURED BY THE METHOD

This application claims the benefit of PCT/KR2008/000119 filed on Jan. 9, 2008, and Korean Patent Application No. 10-2007-0002400 filed on Jan. 9, 2007, the contents of which are hereby incorporated herein by reference for all purposes in their entirety.

TECHNICAL FIELD

The present invention relates to a method for formation of a line pattern using a multiple nozzle head, and more particularly to a method for minimizing the number of movements of a multiple nozzle head when a line pattern is formed on various display panels such as PDP (Plasma Display Panel), LCD (Liquid Crystal Display) and OLED (Organic Light Emitting Display) by means of ink-jet printing using a multiple nozzle head, and a display panel manufactured by the method.

BACKGROUND ART

FIG. 1 is a schematic plane view showing a cell region, a pad region and a connection region of an upper portion of a front surface of a conventional PDP (Plasma Display Panel).

Referring to FIG. 1, a general PDP front panel 10 is briefly classified into a cell region 20 in which a bus electrode (a scan electrode+a sustain electrode) 25 and a back matrix pattern (not shown) are formed, a pad region 30 having a pad block 35 formed around the cell region 20 to electrically connect each bus electrode 25 to an external electrode, and a connection region 40 having a connection wiring 45 for connecting the bus electrode 25 formed in the cell region 20 and the pad block 35 formed in the pad region 30 with each other. Here, the connection wiring 45 is generally inclined diagonally since a gap of the bus electrodes 25 and a gap of the pad blocks 35 are different from each other.

FIG. 2 is a sectional view showing a part of the cell region 20 to illustrate arrangements of bus electrodes X, Y formed in the cell region 20 among three regions shown in FIG. 1.

Referring to FIG. 2, a scan electrode X and a sustain electrode Y make a pair in a strip shape in each cell region 20. Also, electrode pairs (scan electrode X+sustain electrode Y) are successively arranged to configure the entire cell region 20. The scan electrode X and the sustain electrode Y may be formed using photolithography, which however has drawbacks of complicated processes, plenty wasted materials and increased manufacture costs due to the use of a mask. Thus, a method for forming an electrode pattern by ink-jet printing using a multiple nozzle head is recently highlighted. If a scan electrode X and a sustain electrode Y are formed using the ink-jet printing using a multiple nozzle head, it is possible to form several electrode patterns at once.

However, in the conventional electrode pattern forming method using ink-jet printing, the condition for designing gaps of nozzles provided to the multiple nozzle head is not matched with the condition for designing arrangements of scan electrodes and sustain electrodes. Thus, the scan electrode and the sustain electrode cannot be formed at the same time, but a scan electrode forming process and a sustain electrode forming process should be conducted separately. It will be explained below in detail with reference to the figures.

FIG. 3 is a diagram exemplarily showing a design condition for gaps of nozzles provided to a multiple nozzle head and a design condition for arrangements of scan electrodes and sustain electrodes.

Referring to FIGS. 2 and 3, a gap ($D_1$) between scan electrodes (X1 to X3) and a gap ($D_2$) between sustain electrodes (Y1 to Y3) formed in adjacent pixels 20 are generally designed equal to a linear gap ($D_p$) of the pixels 20, respectively. However, if a gap ($D_s$) between the scan electrode (X1 to X3) and the sustain electrode (Y1 to Y3) is designed without considering the gap of nozzles provided to a multiple nozzle head as conventionally, it is impossible to jet the scan electrode (X1 to X3) and the sustain electrode (Y1 to Y3) simultaneously. Thus, in the conventional technique, ink jetting for forming the scan electrode (X1 to X3) and the sustain electrode (Y1 to Y3) should be separately conducted after a pitch of nozzles provided to the multiple nozzle head is matched equal to a height ($D_p$) of the pixel.

The conventional electrode pattern forming method using ink-jet printing shows another problem. Namely, there is much possibility that an electric open circuit occurs in the connection wiring 45 (see FIG. 1) formed in the connection region 40 (see FIG. 1). That is to say, since the gap of bus electrodes formed in the cell region 20 is not equal to the gap of pad blocks formed in the pad region, the connection wiring formed in the connection region is inevitably inclined at a predetermined angle. However, a gap of hit inks is equal to a pitch of nozzles, so the possibility of open circuit is increased in case an inclined line pattern is formed as shown in FIG. 4 rather than the case that a horizontal line pattern is formed. For example, in case the connection wiring is inclined at 45 degrees, an ink hit gap is 1.41 time greater rather than the case that a connection wiring is horizontal, so the possibility of open circuit in the connection wiring is increased by 40%, assuming that the dispersion of ink is identical.

FIG. 5 is a photograph showing a portion of the connection wiring 45 where a open circuit actually occurs. Referring to FIG. 5, it would be found that hit inks are not connected but open-circuited at several points in the connection wiring 45 formed in the connection region 40. If an open circuit occurs in the connection wiring 45, inferior pixels may occur, which is reported as a problem fundamentally unsolved if the design condition for the connection wiring 45 is not improved.

DISCLOSURE

Technical Problem

The present invention is designed to solve the problems of the prior art, and therefore it is an object of the present invention to provide a method for formation of a line pattern using a multiple nozzle head capable of reducing the number of head scans for ink jetting by designing a gap of line patterns to match with a gap condition of nozzles provided to the multiple nozzle head while forming various line patterns formed on various display panels, and a display panel manufactured by the method.

Another object of the present invention is to provide a method for formation of a line pattern using a multiple nozzle head capable of effectively preventing any open circuit in a connection region by changing the design of line patterns formed in a cell region, a connection region and a pad region of a display panel into a linear shape, and a display panel manufactured by the method.

Technical Solution

In order to accomplish the above object, the present invention provides a method for formation of a line pattern using a multiple nozzle head, which includes forming a cell region in which display cells with a height corresponding to a multiple of a line gap of nozzles provided to the multiple nozzle head are repeated in two dimensions; and forming different kinds of first and second line patterns alternatively repeated on the cell region by means of ink-jet printing using the multiple nozzle head, wherein, when the multiple nozzle head scans once, the first line pattern and the second line pattern are formed at the same time under the condition that the height of the display cells and a gap between two associative line patterns are respectively a multiple of the line gap of nozzles provided to the multiple nozzle head.

In the present invention, the first line pattern and the second line pattern may be respectively a scan electrode and a sustain electrode, which are formed on a front panel of PDP (Plasma Display Panel).

Preferably, The method may further include subsequently forming a connection wiring and a pad block, which are straightly extended from each line pattern around the cell region of the display panel, wherein the connection wiring and the pad block have a line width expanded from the line pattern to the pad block by controlling the number of combined ink hit lines formed by the multiple nozzle head. At this time, the gap of two associative pad blocks is a multiple of the line gap of nozzles.

Preferably, a line pattern, a connection wiring and a pad block positioned on the same line are formed at the same time while the multiple nozzle head scans once.

Preferably, the line gap of nozzles is 0.3 to 5 times as large as a diameter of jetted ink drop, and a gap of ink jetting is 0.3 to 5 times as large as a diameter of jetted ink drop when ink is jetted by means of ink-jet printing.

In another aspect of the present invention, there is also provided a display panel, which includes a cell region in which display cells are repeated in two dimensions; and different kinds of first and second line patterns, which are formed in the cell region by means of ink-jet printing using a multiple nozzle head such that the first and second line patterns are alternated, wherein a height of the cell region and a gap of two associative line patterns have a greatest common divisor, and wherein the greatest common divisor may be a multiple of a line width of nozzles of the multiple nozzle head.

In the present invention, the first line pattern and the second line pattern may be respectively a scan electrode and a sustain electrode of a front panel of PDP.

Preferably, the display panel may further include a connection wiring and a pad block, which are subsequently extended straightly from each line pattern around the cell region, wherein the pad block has a line width greater than the line pattern, and the connection wiring is interposed between the line pattern and the pad block such that a line width of the connection wiring is subsequently increased from a line width value of the line pattern to a line width value of the pad block.

Here, a height of the cell region is identical to a height of a pad region in which the pad block is formed. In addition, a gap of two associative pad blocks has a greatest common divisor. Preferably, the greatest common divisor is a multiple of the line width of nozzles of the multiple nozzle head.

DESCRIPTION OF DRAWINGS

Other objects and aspects of the present invention will become apparent from the following description of embodiments with reference to the accompanying drawing in which.

REFERENCE NUMERALS OF ESSENTIAL PARTS IN THE DRAWINGS

Figure 1:
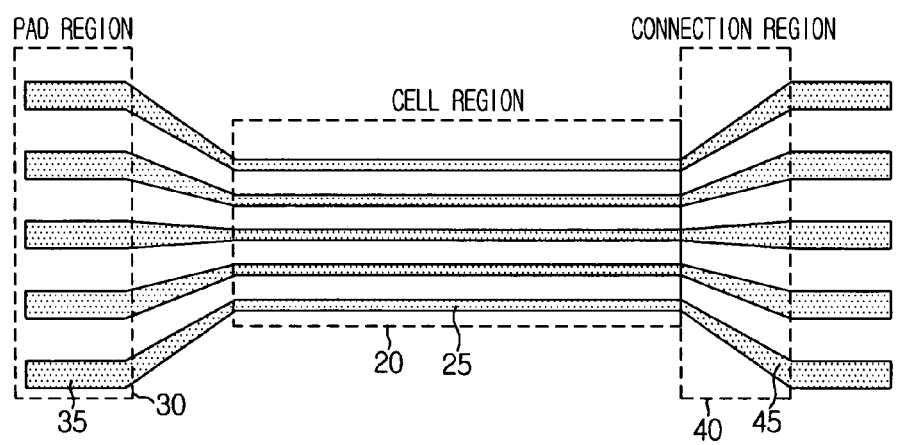
FIG. 1 is a schematic plane view showing a cell region, a pad region and a connection region in an upper portion of a front panel of a conventional PDP (Plasma Display Panel)
Figure 2:
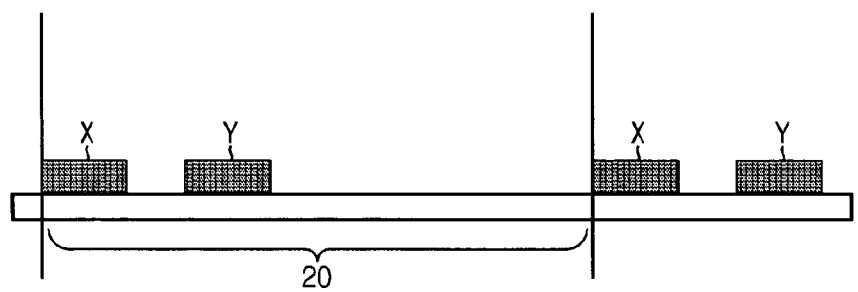
FIG. 2 is a sectional view showing a part of the cell region to illustrate arrangements of bus electrodes (X, Y) formed in the cell region among three regions shown in FIG. 1.
Figure 3:
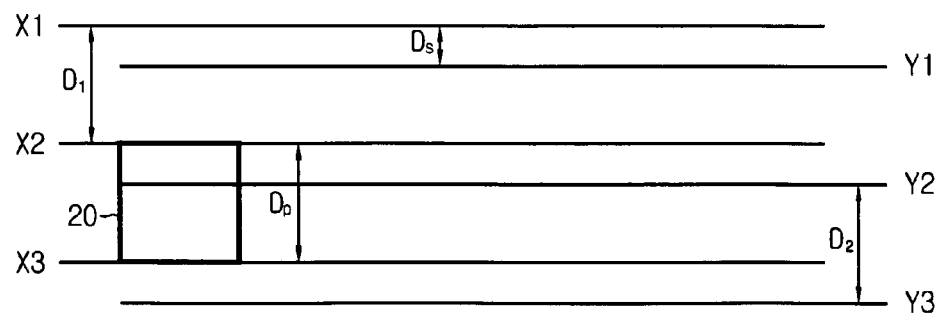
FIG. 3 is a diagram exemplarily showing design conditions for gaps of nozzles provided to a multiple nozzle head and design conditions for arrangements of scan electrodes and sustain electrodes.
Figure 4:
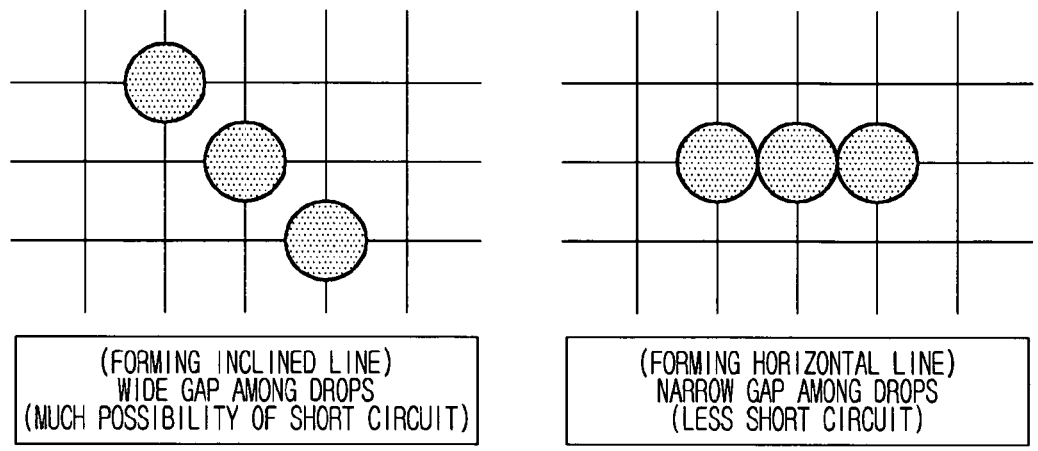
FIG. 4 is a diagram comparatively showing the possibility of open circuits between an inclined line pattern and a horizontal line pattern, formed by ink-jet printing.
Figure 5:
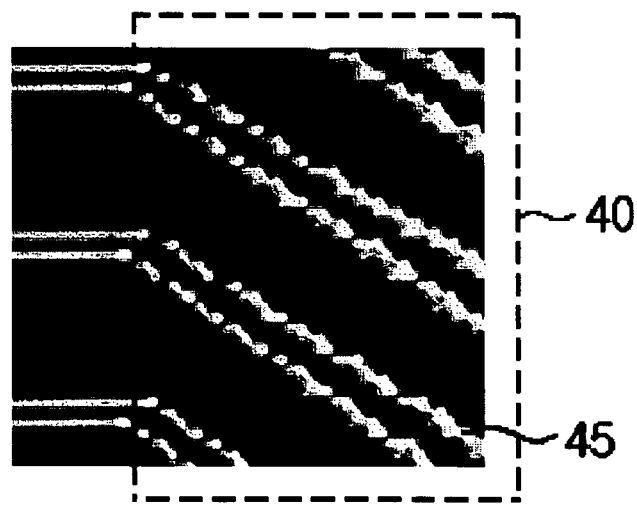
FIG. 5 is a photograph exemplarily showing that an open circuit occurs in a connection wiring formed in the connection region of the upper portion of a front panel of PDP.

20: cell region
30: pad region
40: connection region
25: bus electrode
35: pad block
45: connection wiring
X: scan electrode
Y: sustain electrode
$D_n$: linear nozzle gap
$D_p$: cell height
$D_s$: gap between scan electrode and sustain electrode
100: multiple nozzle head
110: nozzle

BEST MODE

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

Meanwhile, the present invention will be explained in detail on the assumption that a bus electrode, a connection wiring and a pad block (they are all a kind of line patterns) are formed on a PDP (Plasma Display Panel) front panel as one embodiment, but it is apparent to those having ordinary skill in the art that the present invention is not limited in the kind of display panels and the kind of line patterns.

Figure 6:
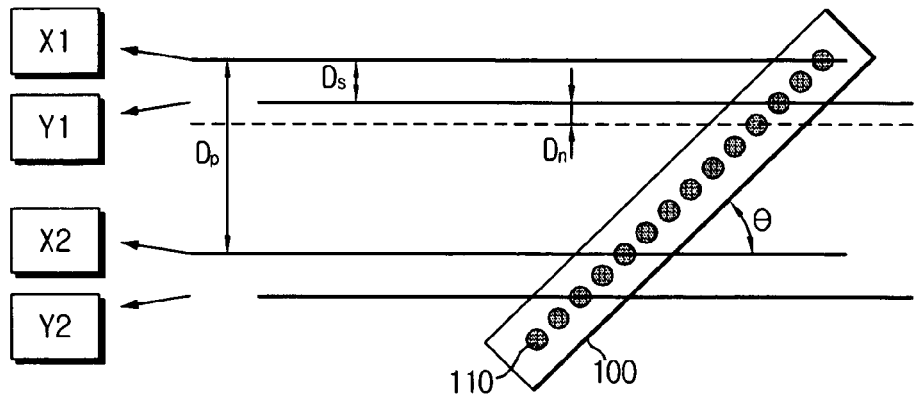
FIG. 6 is a diagram showing design conditions for gaps of nozzles provided to the multiple nozzle head and design conditions for bus electrodes formed in the cell region of the front panel of PDP according to a preferred embodiment of the present invention.

FIG. 6 is a diagram showing design conditions for gaps of nozzles provided to a multiple nozzle head and design conditions for bus electrodes formed in a cell region of the front panel of PDP according to a preferred embodiment of the present invention.

Referring to FIG. 6, when bus electrodes X1, X2, Y1, Y2 are formed by means of ink-jet printing using a multiple nozzle head 100, a pitch of nozzles 110 provided to the multiple nozzle head 100 is not accurately matched with a gap of bus electrode patterns. Thus, the multiple nozzle head 100 is rotated by a predetermined angle θ such that the gap of bus electrode patterns is accurately matched with the gap of ink hit lines. Here, the term 'ink hit line' means a straight line connecting hit points of ink jetted through nozzles. It should be understood that θ may be set as zero if the gap of bus electrode patterns is accurately matched with the gap of ink hit lines though the multiple nozzle head 100 is not rotated.

Meanwhile, the multiple nozzle head 100 has a plurality of nozzles 110 arranged at regular intervals. Thus, if ink is jetted from all nozzles 110, ink hit lines formed by the nozzles have the same intervals. In this reason, if a bus electrode to be formed is not positioned accurately on the ink hit lines formed by the multiple nozzle head 100 but positioned in the middle of them, the entire bus electrode cannot be formed by just one head movement. Thus, the multiple nozzle head should repeat scanning as much as the number corresponding to a group number of bus electrodes not matched with the ink hit lines to form a bus electrode.

In order to solve the above problem, the present invention matches design conditions for gaps of nozzles with design conditions for positions of line patterns such that the line patterns are all positioned on ink hit lines formed by the multiple nozzle head when line patterns with different functions are formed using the multiple nozzle head, and thus the present invention allows reducing the number of scans of the multiple nozzle head.

More specifically, in the present invention, when a gap between scan electrodes X1, X2 and sustain electrodes Y1, Y2 is designed, a distance between the scan electrodes X1, X2 and the sustain electrodes Y1, Y2 and a height $D_p$ of cell (generally, the height of cell is identical to a width of cell) are set as a multiple of a line gap $D_n$ of the nozzles 110 provided to the multiple nozzle head 100. Here, the line gap of the nozzles 110 is a value calculated by a 'nozzle pitch×sin θ' when an angle between the multiple nozzle head 100 and an advancing direction of electrode is θ. If the line gap $D_n$ of the nozzles 110 and the gap between the scan electrodes X1, X2 and the sustain electrodes Y1, Y2 are designed, the scan electrodes X1, X2 and the sustain electrodes Y1, Y2 having different functions are all positioned on the ink hit lines formed by the multiple nozzle head 100, so it is possible to form the scan electrodes X1, X2 and the sustain electrodes Y1, Y2 by only one head scan. Meanwhile, a drop pitch of ink is preferably 0.3 to 5 times as large as a diameter of ink drop such that all inks on the ink hit line are connected without any open circuit.

Figure 7:
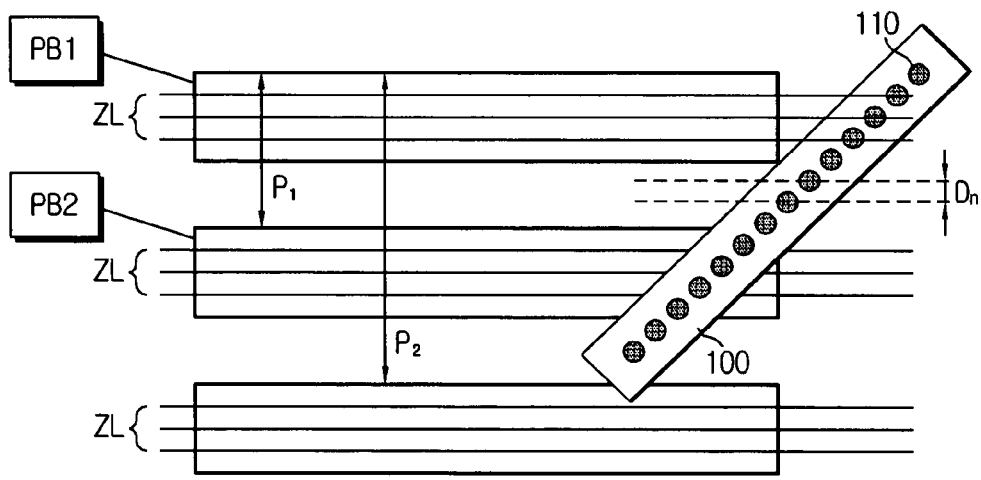
FIG. 7 is a diagram showing design conditions for gaps of nozzles provided to the multiple nozzle head and design conditions for pad blocks formed in the pad region of the front panel of PDP according to a preferred embodiment of the present invention.

FIG. 7 is a diagram showing design conditions for gaps of nozzles provided to the multiple nozzle head and design conditions for pad blocks formed in the pad region of the front panel of PDP according to a preferred embodiment of the present invention.

Referring to FIG. 7, pad blocks PB1, PB2 formed in the pad region are formed in a way that a plurality of ink hit lines ZL formed by at least one nozzle 110 are combined into one. The pad blocks PB1, PB2 are formed to correspond to the bus electrode formed in the cell region in 1:1 relation, and in the figure, PB1 and PB2 are pad blocks for connecting a scan electrode and a sustain electrode to external electrodes, respectively. For example, PB1 is a pad block for connecting a scan electrode in the cell region to an external electrode, and PB2 is a pad block for connecting a sustain electrode in the cell region to an external electrode.

In the present invention, when the pad blocks PB1, PB2 are formed in the pad region, gaps $P_1$, $P_2$ of pad blocks are set as a multiple of the line gap $D_n$ of nozzles. Here, the gaps $P_1$, $P_2$ of pad blocks are defined based on an upper side of each pad blocks. Then, since positions of all ink hit lines ZL to be combined to form the pad blocks PB1, PB2 are accurately coincided with ink hit lines ZL formed by the multiple nozzle head 100, the pad blocks PB1, PB2 connected to the scan electrode and the sustain electrodes may be formed at the same time though the multiple nozzle head 100 scans only once.

Figure 8:
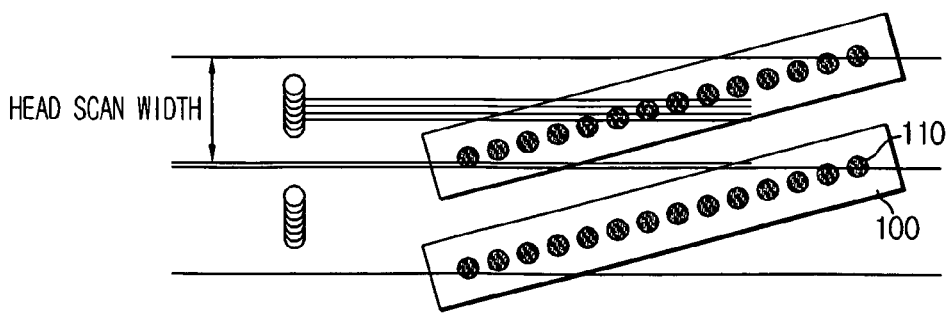
FIG. 8 is a diagram showing hit inks in case the multiple nozzle head has a great inclined angle.
Figure 9:
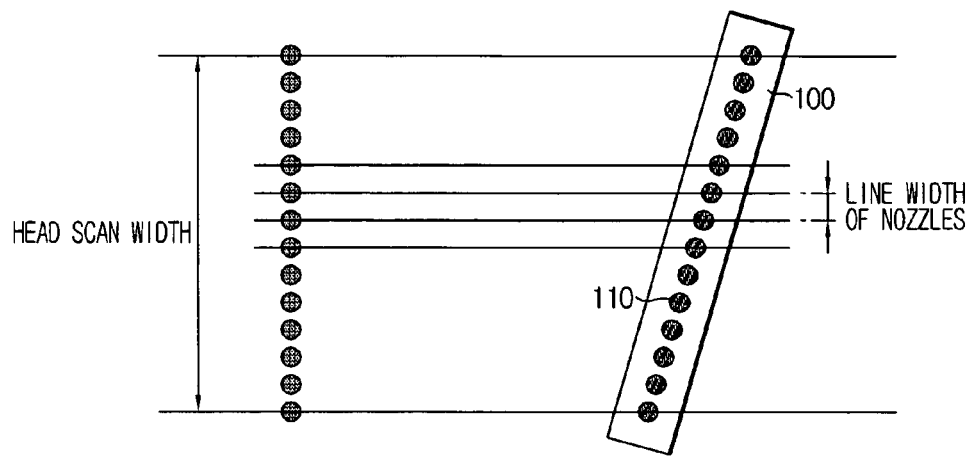
FIG. 9 is a diagram showing hit inks in case the multiple nozzle head has a small inclined angle.

Meanwhile, since the pad blocks PB1, PB2 are formed by combining a plurality of ink hit lines ZL, combination between ink hit lines ZL is determined according to an inclined angle θ of the multiple nozzle head 100. For example, if the multiple nozzle head 100 is greatly inclined to narrow the line gap of the nozzles 110 as shown in FIG. 8, ink drops jetted from the nozzles 110 are combined with each other to broaden the line width. Instead, as the inclination of the multiple nozzle head 100 is increased, a scan width of the nozzle 100 is narrowed, so a greater number of scans should be conducted on the assumption that the ink jetting is performed to the same area. Meanwhile, if the multiple nozzle head 100 is inclined small as shown in FIG. 9, adjacent ink drops may not be combined but may cause an open circuit. Thus, the line gap of the nozzles 110, calculated depending on the inclination angle of the multiple nozzle head 100, should be suitably controlled according to a size of jetted ink drop and a dispersing property of ink. In this consideration, the line gap of the nozzles 110 is preferably 0.3 to 5 times as large as a diameter of jetted ink drop.

In the present invention, it is also possible that the connection wiring formed in the connection region is designed in a straight shape, different from the conventional one, so as to prevent any open circuit from occurring in the connection wiring.

Figure 10:
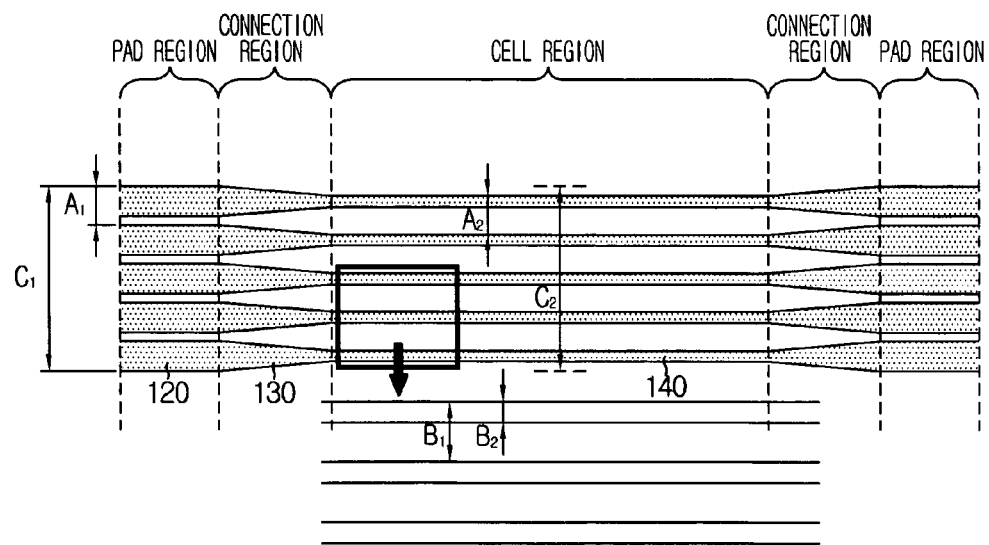
FIG. 10 is a plane view showing the cell region, the connection region and the pad region designed according to the present invention on the whole.

FIG. 10 is a plane view showing the cell region, the connection region and the pad region, designed according to the present invention on the whole.

Referring to FIG. 10, in the present invention, the connection wiring 130 formed in the connection region is designed in a straight shape. Since the pad block 120 and the bus electrode 140 have different widths, the connection wiring 130 has a tapered shape. Since the pad blocks 120 and the bus electrodes 140 correspond to each other in 1:1 relation, a gap $A_1$ of the pad blocks 120 and a gap $A_2$ of the bus electrodes 140 are identical, and each gap is a multiple of the line gap of nozzles. The bus electrode 140 may be formed by means of combination of a plurality of ink hit lines, and in this case a gap $B_1$ of the bus electrodes 140 and a line width $B_2$ of the bus electrodes 140 are also a multiple of the line gap of nozzles.

If the cell region, the connection region and the pad region are designed as mentioned above, a height $C_2$ of the entire cell region is identical to a height $C_1$ of the entire pad region. In addition, if an ink-jetting nozzle is selectively controlled among the plurality of nozzles provided to the multiple nozzle head, the pad block 120, the connection wiring 130 and the bus electrode 140 may be formed at the same time using just one scan. Also, since the connection wiring 130 is designed in a straight shape, it is possible to solve the problem that an open circuit occurs near the connection wiring 130 conventionally.

The above embodiment of the present invention is directed to forming a line pattern in a cell region, a connection region and a pad region of a PDP front panel using the multiple nozzle head. However, the present invention is not limited thereto, but the present invention may be applied to other kinds of display panels if many kinds of line patterns are formed in each cell. For example, the present invention may be widely applied to forming source and drain electrodes of LCD TFT, electrodes of OLED, electrodes of a solar cell, and so on.

<Actual Application>

Figure 11:
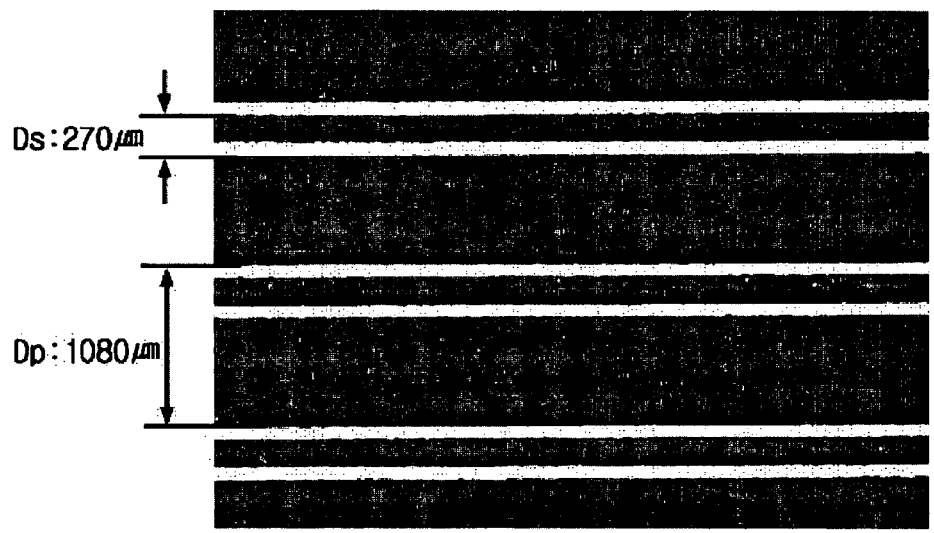
FIG. 11 is a photograph showing a panel in case a scan electrode and a sustain electrode of the PDP front panel are formed according to the present invention.
Figure 12:
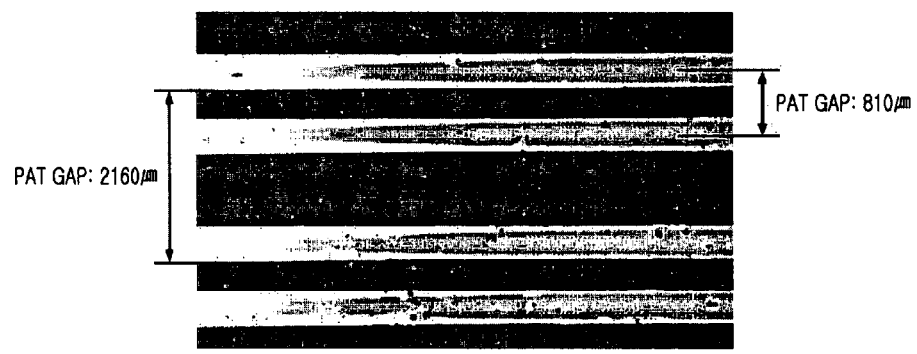
FIG. 12 is a photograph showing a panel in case pad blocks of the PDP front panel are formed according to the present invention.

FIG. 11 is a photograph showing that bus electrodes (scan electrode+sustain electrode) of a PDP front panel are formed using a multiple nozzle head (SE-128 head, produced by Dimatix) having 128 nozzles. SE-128 head has a nozzle gap of 508 um and a nozzle diameter of 38 um. At this time, an ink drop pitch in a horizontal direction is 80 um, which is two times as large as a jetting drop size that is 40 um. A line gap $D_n$ of nozzles is 90 um, which is 2.25 times as large as the jetting drop size. A gap between the scan electrode and the sustain electrode $D_s$ was 270 um and a gap $D_p$ was 1080 um, so they are set as a multiple of the nozzle line gap. Just one head scan was conducted to form six lines, and nozzle numbers used were No. 1, No. 4, No. 13, No. 16, No. 25 and No. 28 from the bottom. FIG. 12 is a photograph showing pad blocks are formed in the pad region. A gap of pad blocks in the same cell is 810 um, and a gap of pad blocks in adjacent cells is 2160 um, so they are all set as a multiple of the nozzle line gap that is 90 um. In addition, each pad block was formed by combining five ink hit lines, and four pad blocks were formed at the same time by means of just one scan.

Figure 13:
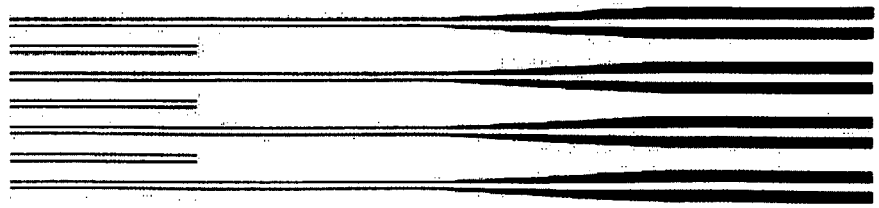
FIG. 13 is a photograph showing a panel in case the cell region, the connection region and the pad region are formed according to the present invention.
Figure 14:
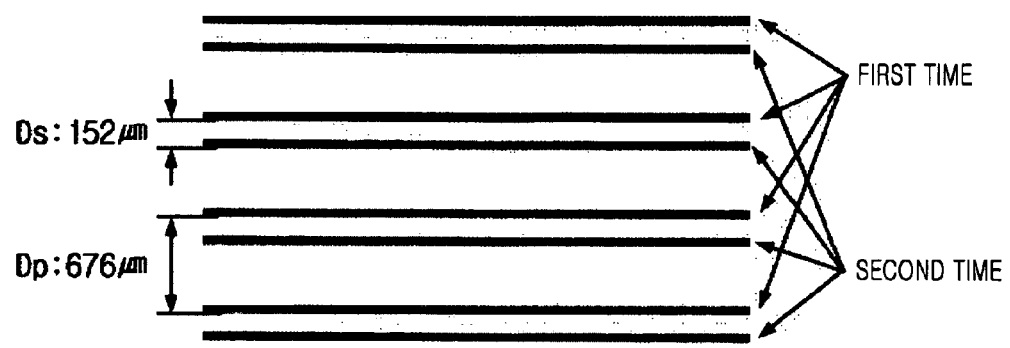

FIG. 13 is a photograph showing an upper portion of a panel in case the cell region, the connection region and the pad region are formed according to the above jetting conditions. Since the connection wiring is designed in a straight shape, the possibility of open circuit near the connection wiring may be decreased.

The present invention has been described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

INDUSTRIAL APPLICABILITY

According to the present invention, when line patterns are formed on a display panel by means of ink-jet printing using a multiple nozzle head, a gap of associative line patterns is set as a multiple of a line gap of nozzles, so it is possible to reduce the number of scans of the multiple nozzle head. In addition, since the line pattern formed in the connection region between the cell region and the pad region of a display panel is designed in a straight shape, it is possible to decrease the possibility of open circuit that may occur while forming a line pattern by ink jetting.

The invention claimed is:

1. A method for formation of a line pattern using a multiple nozzle head, comprising:
   forming a cell region in which display cells with a height corresponding to a multiple of a line gap of nozzles provided to the multiple nozzle head are repeated in two dimensions; and
   forming different kinds of first and second line patterns alternatively repeated on the cell region by means of ink-jet printing using the multiple nozzle head,
   wherein, when the multiple nozzle head scans once, the first line pattern and the second line pattern are formed at the same time under the condition that the height of the display cells and a gap between two associative line patterns are respectively a multiple of the line gap of nozzles provided to the multiple nozzle head.

2. The method for formation of a line pattern according to claim 1, wherein the first line pattern and the second line pattern are respectively a scan electrode and a sustain electrode, which are formed on a front panel of PDP (Plasma Display Panel).

3. The method for formation of a line pattern according to claim 1, further comprising:
   subsequently forming a connection wiring and a pad block, which are straightly extended from each line pattern around the cell region of the display panel,
   wherein the connection wiring and the pad block have a line width expanded from the line pattern to the pad block by controlling the number of combined ink hit lines formed by the multiple nozzle head.

4. The method for formation of a line pattern according to claim 3,
   wherein a line pattern, a connection wiring and a pad block positioned on the same line are formed at the same time while the multiple nozzle head scans once.

5. The method for formation of a line pattern according to claim 3,
   wherein the gap of two associative pad blocks is a multiple of the line gap of nozzles.

6. The method for formation of a line pattern according to claim 1,
   wherein the line gap of nozzles is 0.3 to 5 times as large as a diameter of jetted ink drop.

7. The method for formation of a line pattern according to claim 1,
   wherein, when ink is jetted by means of ink-jet printing, a gap of ink jetting is 0.3 to 5 times as large as a diameter of jetted ink drop.

8. A display panel, comprising:
   a cell region in which display cells are repeated in two dimensions,
   different kinds of first and second line patterns, which are formed in the cell region by means of ink-jet printing using a multiple nozzle head such that the first and second line patterns are alternated, and
   a connection wiring and a pad block, which subsequently extend straight from each line pattern around the cell region,
   wherein a height of the the display cell and a gap of two associative line patterns have a greatest common divisor.

9. The display panel according to claim 8, wherein the greatest common divisor is a multiple of a line width of nozzles of the multiple nozzle head.

10. The display panel according to claim 8, wherein the pad block has a line width greater than the line pattern, and the connection wiring is interposed between the line pattern and the pad block such that a line width of the connection wiring is subsequently increased from a line width value of the line pattern to a line width value of the pad block.

11. The display panel according to claim 10, wherein gaps of any two associative pad blocks has a greatest common divisor.

12. The display panel according to claim 11, wherein the greatest common divisor is a multiply of the line width of nozzles of the multiple nozzle head.

13. The display panel according to claim 8, wherein the first line pattern and the second line pattern are respectively a scan electrode and a sustain electrode of a front panel of PDP.

* * * * *